United States Patent [19]

Gressler et al.

[11] Patent Number: 5,081,103
[45] Date of Patent: Jan. 14, 1992

[54] FLUORINATION OF SUPERCONDUCTING $YBa_2Cu_3O_{7-x}$ POWDER

[75] Inventors: Carole A. Gressler, Macungie; David R. Taschler, Schnecksville, both of Pa.; Jenifer A. T. Taylor, Almond, N.Y.

[73] Assignee: Air Products and Chemicals, Inc., Allentown, Pa.

[21] Appl. No.: 374,329

[22] Filed: Jun. 29, 1989

[51] Int. Cl.$^5$ .............................................. H01L 39/12
[52] U.S. Cl. ........................................ 505/1; 505/742; 505/780; 252/521; 423/593
[58] Field of Search .............. 427/62, 63, 377; 505/1, 505/742, 780; 252/521; 423/593

[56]  References Cited
U.S. PATENT DOCUMENTS 4,916,116  4/1990  Yamazaki .............................. 505/1

OTHER PUBLICATIONS

LaGraff et al, "Magnetic and Structural Properties of $YBa_2Cu_3O_{7-x}F_y$ as prepared by a $NF_3$ gas anneal", Phys. Rev. B. vol. 39 No. 1, Jan. 1989 pp. 347-355.

Primary Examiner—Michael Lusignan
Assistant Examiner—Roy V. King
Attorney, Agent, or Firm—James C. Simmons; William F. Marsch

[57] ABSTRACT

A method of incorporating fluorine into the $YBa_2Cu_3O_{7-x}$ system by annealing $YBa_2Cu_3O_{7-x}$ powder in a fluorine-containing gas, especially $NF_2$ gas. The $YBa_2Cu_3O_{7-x}$ material is annealed in the fluorine-containing gas (either pure $NF_3$ or $NF_3/O_2$ blend of $F_2/N_2$ blend) at a temperature which allows sufficient reactivity with the fluorine gas while maintaining the system well below temperatures at which oxygen incorporation is observed to take place in the normal $YBa_2Cu_3O_{7-x}$ system.

11 Claims, 4 Drawing Sheets

FLUORINATION OF SUPERCONDUCTING YBA$_2$CU$_3$O$_{7-x}$ POWDER

TECHNICAL FIELD

The present invention pertains to enhancing certain properties of YBa$_2$Cu$_3$O$_{7-x}$ superconductors.

BACKGROUND OF THE INVENTION

Of the new class of high temperature superconductors (i.e., transition temperature greater than 90° K.), those consisting of an oxide of yttrium, barium and copper (YBa$_2$Cu$_3$O$_{7-x}$) have received the most attention. While this material possesses a number of benefits, it also displays a number of shortcomings. In particular, careful control of the formulation and processing steps is necessary in order to form the orthorhombic structure of YBa$_2$Cu$_3$O$_{7-x}$ which exhibits superconductivity. Any deviations can lead to the formation of secondary phases which are not superconducting and which reduce the amount of superconducting material present in a given specimen. This material has exhibited poor resistance to atmospheric degradation caused by reaction of contained barium species with CO$_2$ and H$_2$O naturally occurring in the air around us.

Incorporating fluorine into the YBa$_2$Cu$_3$O$_{7-x}$ structure will increase the percent Meissner effect, which is defined as the ratio of the Meissner magnetization to the diamagnetic magnetization at 4.5° K., in direct relationship to the fluorine content after incorporation. This ratio increase indicates the presence of an increased amount of superconducting material in the treated structure or enhanced shielding.

Attempts to synthesize pure YBa$_2$Cu O$_{7-x}$F$_y$ phases have included several different approaches. Solid state synthesis using YF$_3$, YOF, BaF$_2$, CuF$_2$, NH$_4$HF$_2$, or KHF$_4$ as the fluorine source results in the formation of BaF$_2$ with no indication of any phases with superconducting transition temperatures higher than pure YBa$_2$Cu$_3$O$_7$. Ion irradiation with fluorine ions and fluorine (NF$_3$) plasma reactions are processes for fluorine incorporation into the YBa$_2$Cu$_3$O$_{7-x}$ material. Gas phase exchange reactions have focused on F$_2$ as fluorine source and show evidence of fluorine incorporation in samples prepared by treating YBa$_2$Cu$_3$O$_{7-x}$. These products were either semiconducting, or if superconducting, did not show any improved properties over the pure 123 material. Evidence of fluorine substitution was also reported in samples of YBa$_2$Cu$_3$O$_{7-x}$ which were heated with ZnF$_2$; however, this product was not superconducting.

Additional information concerning the state of the art can be obtained from the following references:

A. "Latest Results on High Temperature Superconductivity," S. R. Ovshinsky and R. Young, Energy Conversion Devices, presented at Drexel University Conference on Superconductivity, July 29-30, 1987. (Oral presentation with slides, no hard copy available).

B. "Chemical, Structural, and Electrical Property Studies on the Fluorination of the 90K Superconductor YBa$_2$Cu$_3$O$_{6.8}$," H. H. Wang, et al. (Argonne National Lab), Communication to Inorganic Chemistry, Vol 27, No. 1, pp. 5-8, 1988.

C. "Fluorination of Superconducting Ba$_2$YCu$_3$O$_{7-\delta}$, P. K. Davies, et al. (Univ. of Pennsylvania) Solid State Communications, Vol. 64, No. 12, pp. 1441-1444, 1987.

D. "Effects of Fluorination on the 90K Superconductor Ba$_2$RCu$_3$O$_{7-\delta}$ (R=Y, Eu; $0 < = \delta < = 1$)," S. M. Fine, et al. (AT&T) to appear in Solid State Ionics as part of the Proceedings of the Reactivity of Solids Conference.

E. "Fluorine Oxidation of High-Temperature Superconductors," K. M. Cirillo, et al. (Univ. of Wisconsin) Solid State Communications, Vol. 66, No. 12, pp. 1237-1241, 1988.

F. "Fluorination of the High-T$_c$ Superconductors YBa$_2$Cu$_3$O$_{7-\delta}$," N. N. Sauer, et al. (Los Alamos National Laboratory) Journal of Materials Research, Vol. 3, No. 5, pp. 813-818, September/October 1988.

G. "Neutron Powder Diffraction Study of the Products from Fluorinating YBa$_2$Cu$_3$O$_{7-\delta}$ at Room Temperature and at 400° C.," E. Garcia, et al. (Los Alamos National Laboratory) Journal of Materials Research, Vol. 3, No. 5, pp. 819-824, September/October 1988.

H. "Conversion of La$_2$CuO$_{4-\delta}$ to a Superconductor by Treatment with Fluorine Gas," B. M. Tissue, et al. (Univ. of Wisconsin) Solid State Communications, Vol. 65, No. 1, pp. 51-54, 1988.

I. "Fluorination of High T$_c$ Superconductors YBa$_2$Cu$_3$O$_x$: Influence on the Superconducting Properties," C. Perrin, et al. (Universite de Rennes-I) Physica C 153-155 (1988) pp. 934-935.

J. "Passivation Process of High T$_c$ Superconductors YBa$_2$Cu$_3$O$_{7-x}$ by Fluorine Gas Treatment," A. Tressaud, et al. (Universite de Bordeaux) Modern Physics Letters B, Vol. 2, No. 10 (1988) 1183-1188.

K. "ESR Spectra of High T$_c$ Superconducting Oxides Treated Under Various Atmospheres," J. M. Dance, et al. (Universite de Bordeaux) Solid State Ionics (1988).

L. "Influence of Low-Temperature Fluorination Process on the Characteristics of Superconductors YBa$_2$Cu$_3$O$_{7-x}$ and Bi$_4$(Ca,Sr)$_6$Cu$_4$O$_{16+x}$," A. Tressaud, et al. (Universite de Bordeaux), Solid State Ionics 32/33 (1988).

M. "Fluorine-Implanted Bismuth Oxide Superconductors," R. P. Gupta, et al. (Central Electronics Engineering Research Institute) Applied Physics Letters, Vol. 54, No. 6, Feb. 6, 1989.

N. "Actual Fluorination of Y-Ba-Cu-O High T$_c$ Superconductors by a Solid-Gas Reaction Under NF$_3$ Flow," C. Perrin, et al. (Universite de Rennes I) Superconductor Science and Technology (1989).

SUMMARY OF THE INVENTION

The present invention disclosed herein describes a method for incorporating fluorine into the orthorhombic structure in such a way as to increase the amount of superconducting phase present or enhance shielding, as well as improve resistance to atmospheric degradation. In addition, this invention offers the added benefit of permitting the specimen to be sintered at a lower temperature than possible with conventional YBa$_2$Cu$_3$O$_{7-x}$ material, resulting in less thermal degradation of the sample and lower energy requirements for thermal processing.

Fluorine is incorporated into YBa$_2$Cu$_3$O$_{7-x}$ by annealing YBa$_2$Cu$_3$O$_{7-x}$ powder in a fluorine containing gas. Pure NF$_3$ has been found to be particularly effective although NF$_3$-O$_2$ blends and F$_2$-N$_2$ blends will also have a similar effect.

The fluoride-gas anneal provides a means of structurally incorporating fluorine into the YBa$_2$Cu$_3$O$_{7-x}$ structure. The percent Meissner effect, defined as the ratio of the Meissner magnetization to the diamagnetic magnetization at 4.5 K., is increased with increased fluorine content in the $YBa_2Cu_3O_{7-x}$ material. This indicates the presence of an increased amount of superconducting material or enhanced shielding. Steam tests indicate a greater resistance to water and air degradation in the fluorinated powder compared to untreated $YBa_2Cu_3O_{7-x}$. Fluorinated materials sinter at a lower temperature than unfluorinated material.

DETAILED DESCRIPTION OF THE PREFERRED EMBODIMENT

While the exact mechanism of superconductivity is not yet known, it is believed that annealing $YBa_2Cu_3O_{7-x}$ with the fluorine-containing gas allows fluorine incorporation primarily onto the oxygen vacancies at the O(5) sites or perhaps to some extent at the O(4) sites on the CuO chains. The addition of fluorine reduces the lattice strain making it more "orthorhombic".

Figure 1:
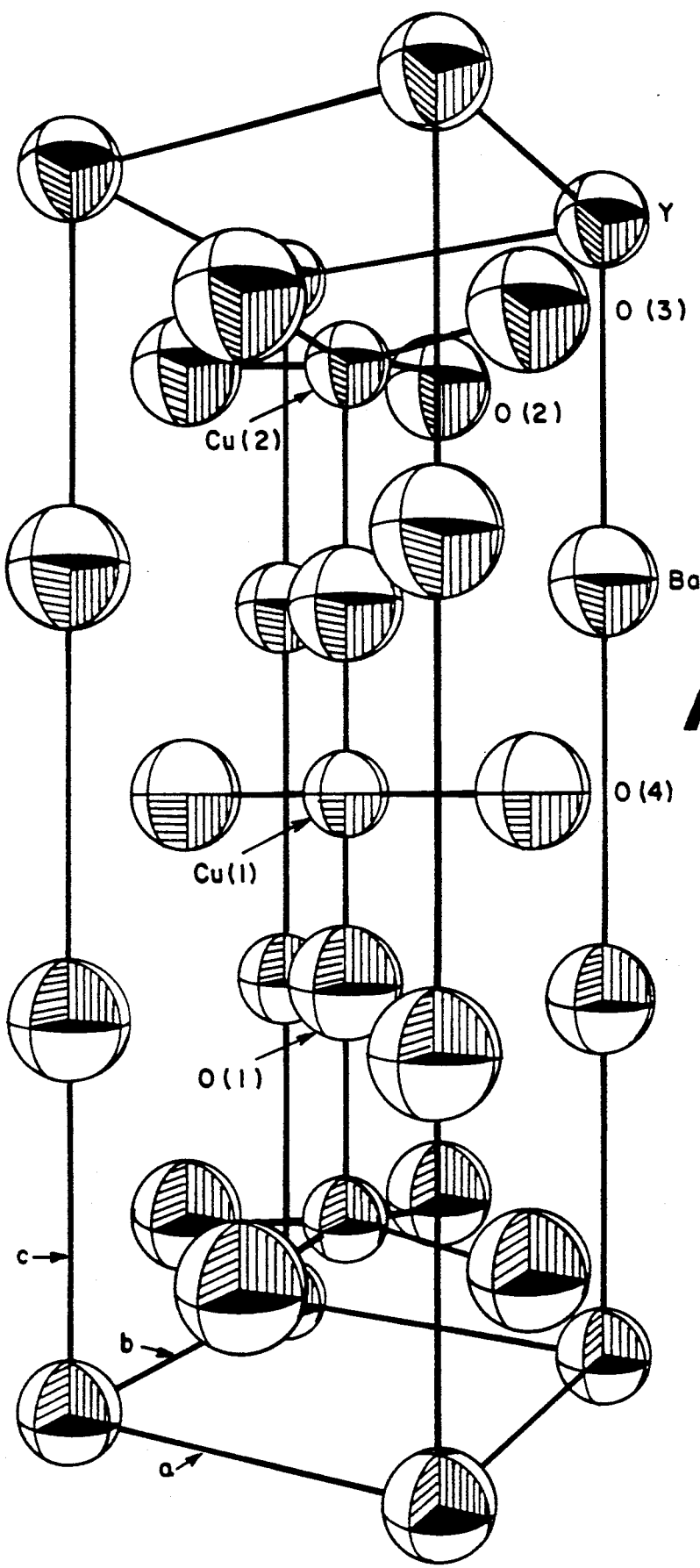
FIG. 1 is a representation of the orthorhombic structure of the $YBa_2Cu_3O_{7-x}$ material, emphasizing the copper-oxygen planes and chains.

The master composition of $YBa_2Cu_3O_{7-x}$ (x=0.35) was prepared via solid state synthesis. Appropriate amounts of $BaCO_3$ (52.9 wt %), $Y_2O_3$ (15.1 wt %), and CuO (32.0 wt %) were ballmilled in a $ZrO_2$ media for 24 hours in distilled water. The raw powder was then calcined for 8 hours at 940° C. in flowing air, ground so as to pass through a 200 mesh sieve, recalcined at 850° C. for 24 hours in oxygen, and reground. X-ray powder diffraction indicated the master composition to be essentially phase pure. Referring to FIG. 1 standard least squares refinement of the data yielded lattice parameters: a=3.8404A, b=3.8815A, and c=11.6676A. Powdered material (mean diameter, 10 μm) rather than sintered pellets was used in order to maximize the surface area for reaction. The prepared powder was then annealed in a fluorine-containing gas.

TREATMENT 1: $NF_3$ AT A CONSTANT TEMPERATURE

Samples of $YBa_2Cu_3O_{7-x}F_y$ (y=0.08-1.11) were prepared by annealing the master composition in $NF_3$ gas for varying lengths of time (5-300 minutes) at a constant temperature (300° C.). The samples were heated to 300° C. in $O_2$ (0.5 l/min), at which time $NF_3$ was allowed to flow through the furnace (0.5 l/min) for the designated amount of time. After the soak, the $NF_3$ flow was ceased and the samples were allowed to furnace cool.

The first set of treatments were performed using a thermal gravametric analysis (TGA) apparatus on 80–100 mg batches ($YBa_2Cu_3O_{7-x}F_y$ y=0.00–0.68). The treatment was later performed in an alumina tube furnace where 8–10 g batches of material could be treated ($YBa_2Cu_3O_{7-x}F_y$, y=0.00–1.11). Fluorine content of all the samples was calculated based on weight gain.

TREATMENT 2: $NF_3/O_2$ BLENDS AT A CONSTANT TEMPERATURE

Samples of $YBa_2Cu_3O_{7-x}F_y$ were prepared by annealing the master composition in $NF_3$ gas and in a 50/50 volume % $O_2/NF_3$ gas mixture, both at a gas flow rate of 0.5 l/min and at 0.25 l/min each. The treatment followed the same procedure as above, except the anneal temperature was 250° C. and the time for each treatment was 10 minutes.

TREATMENT 3: $NF_3/O_2$ BLENDS AT A RAMPED TEMPERATURE

Samples of $YBa_2Cu_3O_{7-x}F_y$ were prepared by annealing the master composition in $NF_3$ gas and in a 50/50 volume % $O_2/NF_3$ gas mixture, both at a gas flow rate of 0.5 l/min and at 0.24 l/min each. The treatment followed the same procedure as in Treatment 1 except the heating profile was a ramp from 200°–300° C. at a rate of 2° C./minute during which $NF_3$ flowed over the powder.

TREATMENT 4: $F_2/N_2$ BLENDS

Samples of $YBa_2Cu_3O_{7-x}F_y$ were prepared by annealing the master composition in a 10/90% $F_2/N_2$ gas mixture. This treatment followed the same procedure as Treatment 3, except the heating profile was a ramp from 200° to 550° C. at a rate of 4° C./minute.

TGA

The reaction times tested for the $NF_3$ gas anneal ranged from 5 to 300 minutes which corresponded to fluorine contents from y=0.08–0.68. Fluorine incorporation was observed to increase with longer fluoride gas soaks as expected. In the TGA, a batch of 80–100 mg of the $YBa_2Cu_3O_{7-x}$ material was heated at a ramp rate of 5° C./min in $O_2$ at 40 psi to 300° C. At this moment the $O_2$ was reduced and $NF_3$ at 10 psi was pulsed in for the desired treatment time. After the $NF_3$ pulse, the sample was allowed to furnace cool. The $O_2$ was increased until the temperature was less than 250° C. at which time the $O_2$ was reduced and $N_2$ was added to purge the system.

Samples which were treated using a ramped heat treatment also gained weight as a function of time. At slower ramp rates, which corresponds to longer treatment times, the sample gained more weight; i.e., incorporated more fluorine. Ramp rates of 0.5° C./min (200 min), 1.0° C./min (100 min), and 2.0° C./min (50 min) resulted in weight gains of 2.8%, 2.5%, and 2.0%, respectively.

To determine the reaction temperature of the 10/90% $F_2/N_2$ treatment, samples were first heated at a rate of 5° C./min to 200° C. then held for a 30-minute soak. No weight gain resulted. Following this, the samples were ramped at 2° C./min to 350° C., then at 4° C./min to 500° C., both showing no weight gain. Finally, samples heated at 4° C./min from 200° C. to 550° C. showed a weight gain beginning around 500° C. of 2.3 wt %.

TUBE FURNACE

Batches of 8-10 g were prepared in a sealed tube furnace. The $YBa_2Cu_3O_{7-x}F_y$ material was heated in $O_2$ (0.5 l/min) to 300° C. for Treatment 1, 250° C. for Treatment 2, 200° C. for Treatments 3 and 4. At this time the $O_2$ was replaced by flowing $NF_3$ (0.5 l/min) or $NF_3/O_2$ or $F_2/N_2$. Typical treatment times ranged from 5 to 60 minutes (not including ramp treatment times), yielding corresponding fluorine contents from 0.22–1.11. One sample was treated in $NF_3$ for 600 minutes. This sample underwent an orthorhombic to tetragonal phase transition rendering the $YBa_2Cu_3O_{7-x}$ material nonsuperconducting and resulted in a substantial amorphous phase.

The material from Treatment 1 underwent the most extensive testing which included X-ray diffraction, neutron diffraction, superconducting quantum interference device (SQUID) measurements, Meissner testing (levitation) and steam degradation tests. Material from remaining treatments were examined using X-ray diffraction, Meissner testing (levitation) and steam degradation tests.

TREATMENT 1

Figure 2A:
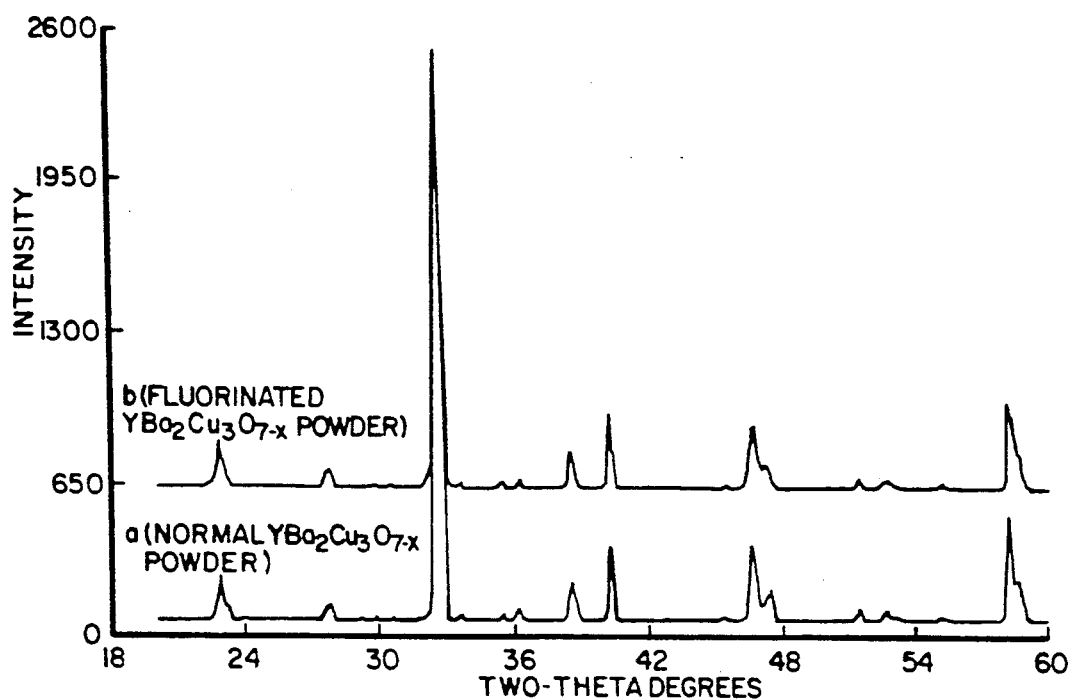
FIG. 2A is the X-ray Powder Diffraction Pattern for a normal superconducting $YBa_2Cu_3O_{7-x}$ powder (a) and a typical sample of fluorinated superconducting $YBa_2Cu_3O_{7-x}$ powder (b).
Figure 2B:
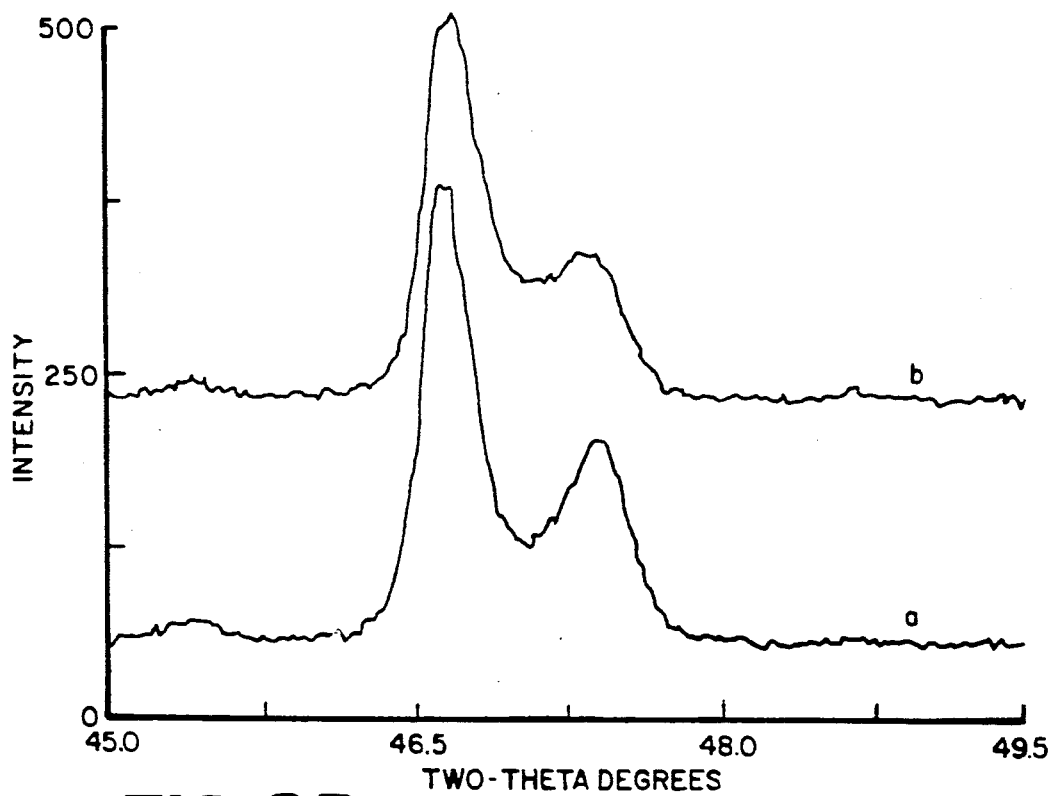
FIG. 2B is enlarged Portion of the X-ray Powder Diffraction Patterns of FIG. 2A.
Figure 3:
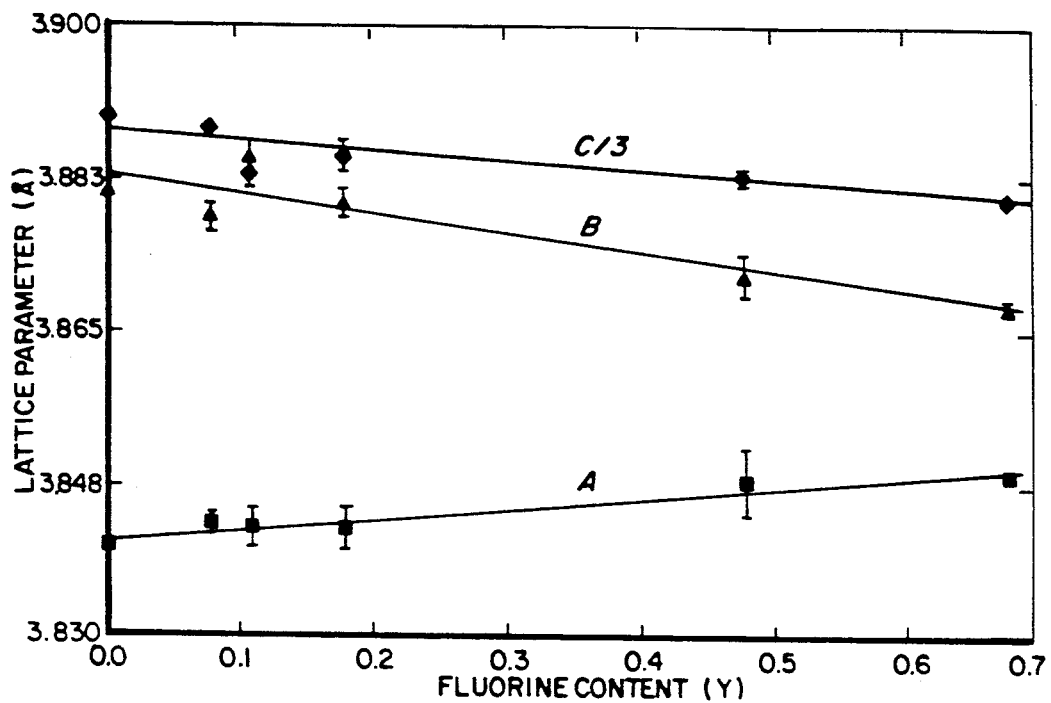
FIG. 3 is plot of X-ray diffraction lattice parameters as a function of fluorine content for $YBa_2Cu_3O_{7-x}F_y$.

The result of the treatment of the $YBa_2Cu_3O_{7-x}$ material with a fluorine-containing gas was the incorporation of fluorine into the system. As shown in FIG. 1A, X-ray powder diffraction indicated no growth of secondary phases (>0.5 vol %) with increased fluorine content as has been found in various alternative routes of incorporating fluorine. The powder patterns showed essentially single phase orthorhombic material (same as master composition) with some differences at the peaks associated with the CuO bond lengths along the chains. The doublet at 47° 2θ as shown in FIG. 1B (associated with the CuO bond lengths along the chains) was observed to broaden with increasing fluorine content. The lattice parameters, as measured by X-ray and neutron powder diffraction, indicated an expansion of the a-axis with concurrent contraction of the b- and c-axes with increased fluorine content as shown in FIGS. 2 and 3. The a- and b-axes behaved as though the material was becoming tetragonal (i.e., oxygen leaving the system), while the c-axis behaved as if the material was becoming orthorhombic (i.e., oxygen entering the system). This would be consistent with two fluorine ions being introduced into the chain sites. The a and b axes would approach each other and the c-axis would contract because fluorine occupation of the anion sites would increase the electrostatic attraction between the planes.

There exists a decrease in the orthorhombic strain after fluorination of the $YBa_2Cu_3O_{7-x}$ material. This would coincide with fluorine occupying the normally vacant O(5) site between barium ions. The fluorine would act to reduce the electrostatic repulsion between the barium ions, thereby decreasing the lattice strain.

Figure 4:
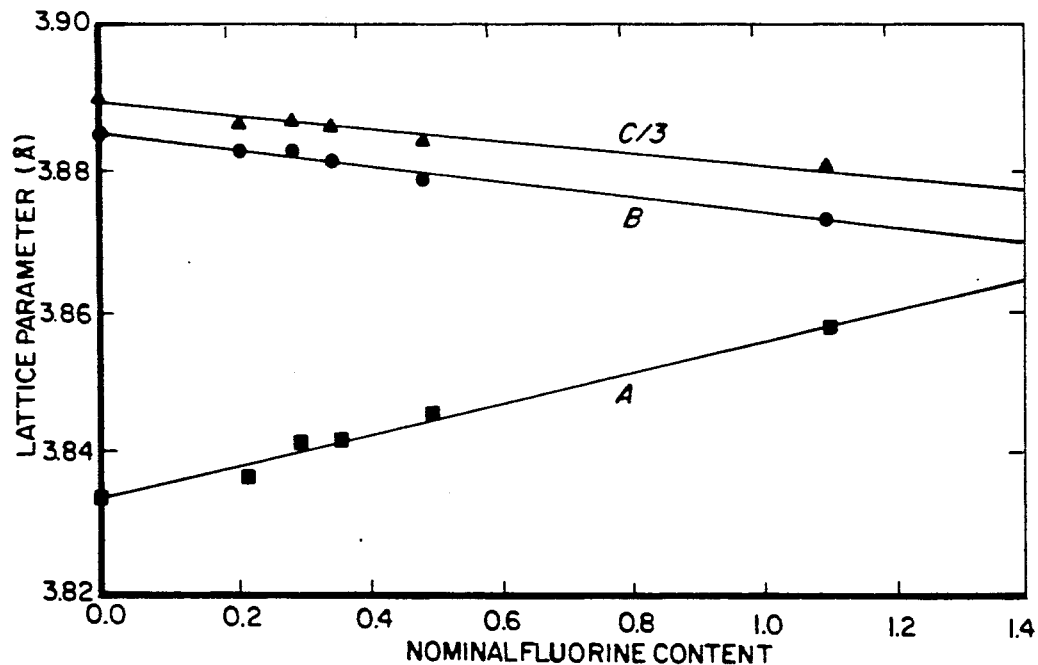
FIG. 4 is a plot of lattice parameters as determined from neutron powder diffraction data of $YBa_2Cu_3O_{7-x}F_y$ as a function of fluorine content.

Neutron diffraction also indicated the fractional O(5) site occupancy increases with increasing nominal fluorine content, while the fractional O(4) site occupancy remains essentially constant as shown in FIG. 4. Oxygen may only significantly occupy the O(5) site if the sample is rapidly quenched and/or driven through the orthorhombic to tetragonal phase transition, both of which result in the partial occupancy of the O(5) site at the expense of the O(4) site. When this occurs, the c-axis is observed to expand as the decrease in the chain site oxygen occupancies reduces the electrostatic screening of the $Ba^{2+}$-$Ba^{2+}$ ion repulsion. The incorporation of fluorine onto the O(5) site effectively screens this repulsion, which results in the observed contraction of the c-axis in the fluorinated samples.

Fluorination of the orthorhombic material processed in the TGA caused no significant change in $T_c$, but did improve magnetic properties, particularly near liquid nitrogen temperatures. Table 1 shows selected data for these tests.

TABLE I
SELECTED DATA FOR $YBa_2Cu_3O_{7-x}F_y$

| Sample | Anneal Time (Min) | Oxygen Content[A] $(O_{7-x})$ X | Fluorine Content $(F_y)$ | $T_c$[B] (°K.) | Magnetization[C] (−emu/g) $M_D$ (ZFC) | $M_M$ (FC) | Meissner Effect[D] |
|---|---|---|---|---|---|---|---|
| 1[E] | 0 | 0.35 | 0.00 | 90 | 0.30 | 0.11 | 37% |
| 2[F] | 0 | 0.00 | 0.00 | 91 | 0.28 | 0.12 | 43% |
| 3 | 5 | 0.35 | 0.08 | 90 | 0.31 | 0.13 | 43% |
| 4 | 10 | 0.35 | 0.11 | 90 | 0.31 | 0.16 | 52% |
| 5 | 30 | 0.35 | 0.18 | 90 | 0.33 | 0.16 | 49% |
| 6 | 90 | 0.35 | 0.32 | 90 | 0.32 | 0.16 | 50% |
| 7 | 300 | 0.35 | 0.68 | 91 | 0.30 | 0.17 | 58% |

Figure 5:
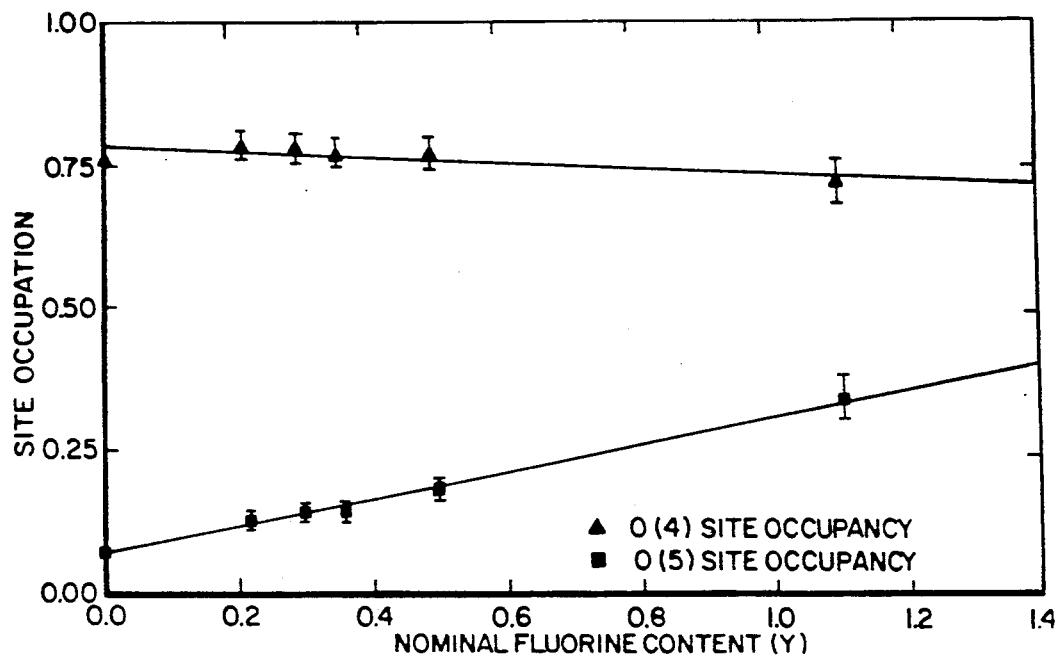
FIG. 5 is a plot of site occupation of the O(4) and O(5) sites as a function of nominal fluorine content for $YBa_2Cu_3O_{7-x}F_y$.
Figure 6:
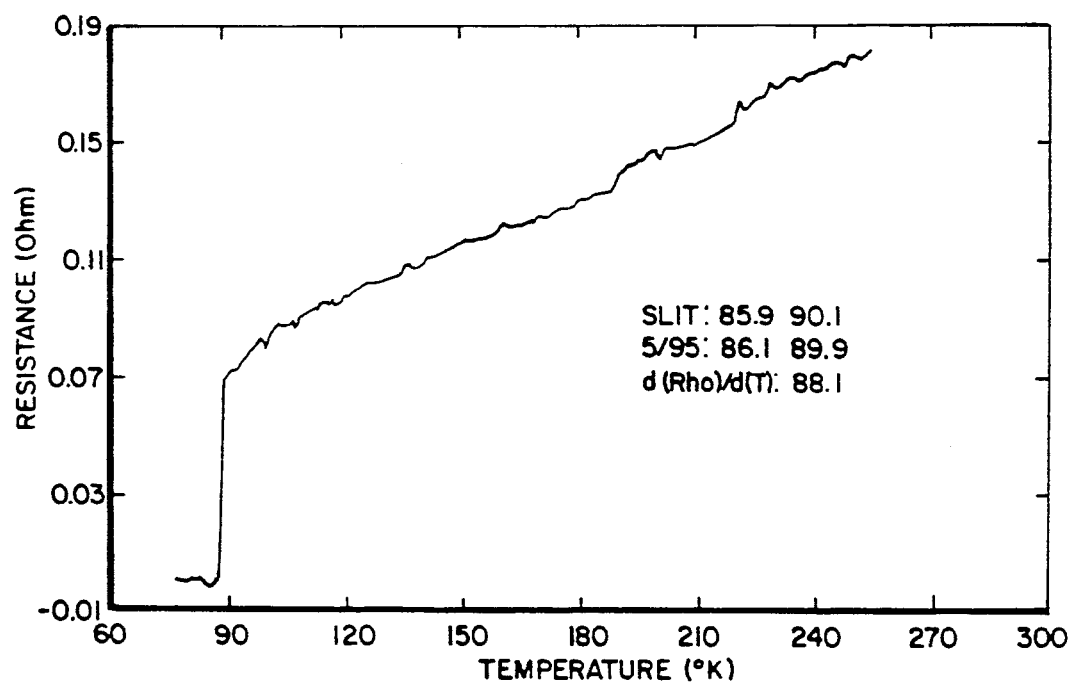
FIG. 6 is a plot of resistance against temperature for a sample treated according to the invention.

[A]Assumes oxygen content is unaffected by $NF_3$ gas anneal
[B]Defined at M = 0
[C]At 4.5 K. in applied field at 100 gauss
[D]Defined as $M_M/M_D$ at 4.5 K.
[E]Master composition, normal
[F]Fully oxygenated master composition Magnetization near liquid nitrogen temperatures of the sample y=0.68 for both the flux exclusion and expulsion were two to three times greater than in the starting material (x=0.35, y=0.0) and fully oxygenated sample (x=0.0, y=0.0). Values for the critical current, $J_c$ as estimated from the magnetization curves also demonstrate a relative increase with increased fluorine content; however, some optimum limit of fluorine appears to occur near y=1.0, after which $J_c$ begins to decrease. The Meissner effect, an indication of the percent superconducting material present, also increased with fluorine content. The Meissner effect of the fully oxygenated sample possesses a Meissner effect of 43%, which is greater than the starting material with 37%, but less than all but one of the fluorinated samples (43% for y=0.08). The other fluorinated samples, y>0.08, show increased Meissner effect, reaching 58% at y=0.68. Another test for the presence of superconducting phase in the fluorinated sample was to verify that the electrical resistance of the sample dropped to zero at $T_c$ of about 90° K. as shown in FIG. 5.

Infrared spectroscopy data on pure and fluorine-exposed $YBa_2Cu_3O_{7-x}$ powder showed a peak related to the Cu-O(4) bonds change with apparent fluorine content. If the O(4) site was occupied by an oxygen ion, no peak could occur; this would be a forbidden transition. The presence of the peak appeared to indicate some ion besides oxygen was in the O(4) site. A similar peak is present for $YBa_2Cu_3O_{7-x}$ that is oxygen deficient [O(4) vacancies are created]. There were no oxygen vacancies present in the starting material because it did not gain weight on oxygen annealing. Therefore, it can be inferred that there might be some fluorine on the O(4) lattice sites.

Steam degradation tests, an accelerated aging test, performed on both fluorinated and unfluorinated powder indicated an increase in resistance to atmospheric attack for the fluorinated samples. A steam treatment was chosen, rather than immersion in distilled water, after initial tests using immersion for 24 hours totally destroyed all the samples. Steam treated samples were made by placing pure and fluorinated $YBa_2Cu_3O_{7-x}$ on watch glasses over boiling water in a covered glass container. Exposure time in the steam atmosphere was 15 minutes. X-ray diffraction patterns of the samples before and after steam treatment were compared. After steam treatment, the untreated sample showed severe degradation of the $YBa_2Cu_3O_{7-x}$ phase, nearly disappearing from the sample, and $BaCO_3$ was formed. These specimens consistently showed weight gains of over 10.0 wt %. The fluorinated samples, although indicating the presence of a small amount of $BaF_2$, showed the preservation of $YBa_2Cu_3O_{7-x}$ after the treatment. Weight gains were always less than 3.0 wt % in these samples.

Results have also been analyzed for a sintered bar made from the fluorinated powder. The fluorinated powder yielded a dense ceramic upon firing which was superconducting and required a lower sintering temperature than the untreated $YBa_2Cu_3O_{7-x}$. To determine the proper maximum sintering temperature, bars pressed from the fluorinated material were heated to 900° C., held for 2 hours, cooled, all in flowing $O_2$ at 0.5 l/min, and evaluated. The proper temperature was determined when the bars had structural integrity. At this time the bars would be annealed for 12 hours in $O_2$ at 0.5 l/min at 550° C. Structural integrity was achieved when the bars were not weak and crumbly and it was not possible to "write" on a piece of paper with the bar. That is, the material achieved enough grain connectivity to prevent a bar from leaving a black trace on a piece of paper. If structural integrity was not achieved, the firing temperature was incrementally increased by 20° C. over the previous temperature, soaked for 2 hours, then cooled. The bars were sintered to a "non-writeable" quality (possessed structural integrity) at 950° C., 30° C. lower than the sintering temperature of untreated $YBa_2Cu_3O_{7-x}$. The sintered fluorinated powder did illustrate the Meissner effect and demonstrated zero resistivity as expected. Repeated testing of a bar prepared in September 1988 indicates the fluorinated material results in slower degradation of superconducting properties. After ten cycles over the five months following the preparation of the bar, it was still a superconductor.

TREATMENTS 2, 3, 4

Fluorinated $YBa_2Cu_3O_{7-x}$ powder processed via Treatment 2, 3, or 4 all showed a weight gain following exposure to the fluorinated gas. X-ray diffraction of the fluorinated powders mimicked those of samples from Treatment 1. All were almost identical to the diffraction pattern for the phase pure $YBa_2Cu_3O_{7-x}$ material. All powders fluorinated via Treatments 2, 3, 4, displayed the Meissner effect and showed improved resistance to atmospheric degradation compared to untreated powders. Results of samples sintered using fluorinated powders from Treatments 2, 3, and 4 paralleled those of Treatment 1.

The initial attempt at incorporating fluorine into the $YBa_2Cu_3O_{7-x}$ system was via solid state synthesis. Two master batches were prepared; the first of the nominal composition $YBa_2Cu_3O_{7-x}$ and the second of $YBa_2Cu_3F_4O_5$. The proper ratios of $BaCO_3$ (or $BaF_2$), $Y_2O_3$, and CuO were prepared as described in (5) of this section above. The resulting two powders were determined by x-ray analysis to be phase pure $YBa_2Cu_3O_{7-x}$ in the first batch, while the second batch consisted mainly of $BaF_2$, CuO, several unidentified phases, and no $YBa_2Cu_3O_{7-x}$ structure. Appropriate amounts of each master batch were intimately mixed to yield the nominal composition $YBa_2Cu_3F_2O_6$. Bars of both the fluoride mixture and pure $YBa_2Cu_3O_{7-x}$ were pressed, then sintered and annealed in oxygen. Direct resistive measurements yielded $T_c=89K$ and $T_c=84K$ for the $YBa_2Cu_3O_{7-x}$ and fluoride mixture bars, respectively. X-ray powder diffraction patterns show almost phase pure material in the $YBa_2Cu_3O_{7-x}$ bar, with only small amounts of $YBa_2Cu_3O_{7-x}$ in the fluoride mixture bar. Magnetization measurements indicate the diamagnetic shielding and Meissner magnetizations are both far greater for the $YBa_2Cu_3O_{7-x}$ bar, which gives a percent Meissner effect of 31% as compared to only 23% for the fluoride mixture bar.

An attempt was made to fluorinate tetragonal $YBa_2Cu_3O_{7-x}$ material (x=0.60-0.92) with the $NF_3$ anneal treatment process described above. Fluorine is readily absorbed into the material; however, x-ray analysis indicates complete destruction of the $YBa_2Cu_3O_{7-x}$ structure after approximately 3 minutes with several unknown phases present.

Treatment using $NF_3$ at temperatures exceeding 300° C. caused an exothermic reaction which resulted in destruction of the $YBa_2Cu_3O_{7-x}$ superconducting material. An extended $NF_3$ treatment (treatment time=10 hours) caused an orthorhombic to tetragonal phase transition rendering the $YBa_2Cu_3O_{7-x}$ material non-superconducting and resulted in a substantial amorphous phase.

Treatment using $NF_3$ at temperatures of 200° C. or less showed no change in physical appearance or weight gain, indicating no reaction. Treatment using 10/90% $F_2/N_2$ showed no reaction below 500°-550° C.

The operative temperature limits for the $NF_3$ and $NF_3/O_2$ treatment are 250° C.-300° C. To determine the reactivity of the $YBa_2Cu_3O_{7-x}$ system with the $NF_3$ gas, two preliminary runs were performed by thermogravimetric analysis (TGA) to monitor fluorine uptake in both orthorhombic and tetragonal (x=0.60-0.92) samples as a function of temperature. Both materials appeared to begin reacting with the $NF_3$ gas at approximately the same temperature (250° C.); however, the tetragonal sample appeared to incorporate fluorine more readily than the orthorhombic material, after which the fluorine incorporation rates for both materials became uniform. From these two runs a temperature (300° C.) was selected at which to anneal the samples. This temperature allowed sufficient reactivity with the $NF_3$ gas, while maintaining the system below those temperatures (e.g., 400°-600° C.) at which oxygen incorporation is observed to take place in the normal $YBa_2Cu_3O_{7-x}$ system. Exceeding these temperature limits causes an exothermic reaction which results in the destruction of the superconducting phase. Samples treated below the temperature limit, 200° C., showed no physical change nor weight gain, indicating no reaction.

$YBa_2Cu_3O_{7-x}$ may be prepared with alternative raw materials than those utilized in this process. These include using BaO; $CuO_2$; the nitrates of Ba, Cu and Y; other compounds of Ba, Cu, and Y in conjunction with nitric acid; and the metals Ba, Cu and Y.

Based on gas chemistry, many fluoride-containing gases may be utilized in place of nitrogen trifluoride. These include chlorine trifluoride, fluorine, hydrogen fluoride, phosphorus pentafluoride, and/or any mixture thereof.

The gas phase treatment according to the present invention offers a simplified method of incorporating fluorine into the $YBa_2Cu_3O_{7-x}$ system. Preliminary structural studies indicate this may be a method of selectively entering fluorine into a particular site in the $YBa_2Cu_3O_{7-x}$ structure. The treatment yields powder with improved magnetic properties, increased superconducting material of enhanced shielding, improved resistance to water and air degradation, and reduced sintering temperatures.

Having thus described our invention what is desired to be secured by Letters Patent of the United States is set forth in the appended claims.

We claim:

1. A process for incorporating fluorine into $YBa_2Cu_3O_{7-x}$ comprising the step of annealing oxygen deficient $YBa_2Cu_3O_{7-x}$ powder at a temperature of between 200° and 300° C. in a gaseous atmosphere containing fluorine provided from the group consisting of chlorine trifluoride, nitrogen trifluoride, hydrogen fluoride, phosphorous pentafluoride and mixtures thereof, whereby said powder shows improved resistance to atmospheric degradation.

2. A process according to claim 1 wherein said gaseous atmosphere is essentially $NF_3$.

3. A process according to claim 1 wherein said gaseous atmosphere consists essentially of up to 50% by volume oxygen, balance $NF_3$.

4. A process according to claim 1 wherein said anneal treatment is conducted at a constant temperature for a time period between five minutes and five hours.

5. A process for incorporating fluorine into $YBa_2Cu_3O_{7-x}$ comprising the steps of:

preparing a master composition of $YBa_2Cu_3O_{7-x}$ wherein $x=0.35$ by ballmilling appropriate amounts of $BaCO_3$, $Y_2O_3$ and CuO in a $ZrO_2$ media in distilled water, calcining the raw powder in flowing air at elevated temperature, grinding said powder to pass through a 200 mesh sieve, recalcining the powder in oxygen at elevated temperature followed by regrinding; and annealing said master composition at a temperature of between 200° and 550° C. in a gaseous atmosphere containing fluorine provided from the group consisting of chlorine trifluoride, nitrogen trifluoride, hydrogen fluoride, phosphorous pentafluoride and mixtures thereof, whereby said powder shows improved reistance to atmospheric degradation.

6. A process according to claim 5 wherein said first calcining is carried out at a temperature of about 940° C. and said second calcining is carried out at a temperature of about 850° C.

7. A process according to claim 5 wherein said gaseous atmosphere is $NF_3$.

8. A process according to claim 5 wherein said gaseous atmosphere consists essentially of up to 50% by volume oxygen, balance $NF_3$.

9. A process according to claim 5 wherein said annealing treatment is conducted at a constant temperature for a time period of between five minutes and five hours.

10. A process for improving the resistance of $YBa_2Cu_3O_{7-x}F_y$ to degradation caused by atmospheric $CO_2$ and $H_2O$ by annealing oxygen deficient $YBa_2Cu_3O_{7-x}$ powder at a temperature of between 200° and 550° C. in a gaseous atmosphere containing fluorine provided from the group consisting of chlorine trifluoride, fluorine, nitrogen trifluoride, hydrogen fluoride, phosphorous pentafluoride and mixtures thereof.

11. A process for increasing the Meissner effect and amount of superconducting phase in a sample of $YBa_2Cu_3O_{7-x}F_y$ or enhancing shielding by annealing oxygen deficient $YBa_2Cu_3O_{7-x}$ powder at a temperature of between 200° and 550° C. in a gaseous atmosphere containing fluorine provided from the group consisting of chlorine trifluoride, fluorine, nitrogen trifluoride, hydrogen fluoride, phosphorous pentafluoride and mixtures thereof.

* * * * *